US007167385B2

(12) United States Patent
Chan et al.

(10) Patent No.: US 7,167,385 B2
(45) Date of Patent: Jan. 23, 2007

(54) METHOD AND APPARATUS FOR CONTROLLING THE TIMING OF PRECHARGE IN A CONTENT ADDRESSABLE MEMORY SYSTEM

(75) Inventors: Yuen Hung Chan, Poughkeepsie, NY (US); Masood Ahmed Khan, Cedar Park, TX (US); Michael Ju Hyeok Lee, Austin, TX (US); Ed Seewann, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 11/055,802

(22) Filed: Feb. 11, 2005

(65) Prior Publication Data

US 2006/0181908 A1    Aug. 17, 2006

(51) Int. Cl.
*G11C 15/00* (2006.01)
(52) U.S. Cl. .......................... 365/49; 365/203; 365/233
(58) Field of Classification Search .................. 365/49, 365/204, 233
See application file for complete search history.

(56) References Cited

U.S. PATENT DOCUMENTS

| 4,618,968 | A | 10/1986 | Sibigtroth |
| 4,723,224 | A | 2/1988 | Van Hulett et al. |
| 5,383,146 | A | 1/1995 | Threewitt |
| 6,289,414 | B1 | 9/2001 | Feldmeier et al. |
| 6,646,900 | B2 | 11/2003 | Tsuda et al. |
| 6,738,862 | B1 | 5/2004 | Ross et al. |
| 6,744,688 | B2 | 6/2004 | Gillingham et al. |
| 6,775,168 | B1 * | 8/2004 | Park et al. ..................... 365/49 |
| 6,839,256 | B1 | 1/2005 | Proebsting et al. |
| 2002/0032681 | A1 | 3/2002 | Feldmeier et al. |

OTHER PUBLICATIONS

Arsovski et al., "A Ternary Content-Addressable Memory . . .", IEEE Journal of Solid State Circuits, vol. 38, No. 1, (Jan. 2003).
Berkeley, "EE141 Lecture 19-Sequential Logic" (Fall 2004).
Crunch, "Exploring the Basics of AC Scan". Inovys (c) Jul. 2004.
DEFOSSEZ, "XAPP202 Xilinx—CAM in ATM Applications" (Jan. 2001).

(Continued)

*Primary Examiner*—David Lam
(74) *Attorney, Agent, or Firm*—Mark E. McBurney; Mark P. Kahler (57) ABSTRACT

A CAM system is disclosed in which compare data, for example an address translation request, is provided as input search data to a search line generator. The search line generator presents search line input data, through a buffer, to CAM and RAM array systems that include dynamically precharged and evaluated memory cells. Timing sequences in the CAM system are controlled by a series of individually triggered one shot pulse generators. The one shot pulse generators control the timing of CAM system activities, for example the precharge of CAM subsystems, so that these activities are staggered in time. This timing approach improves power consumption and evaluation time within the CAM system. By distributing precharging activities in time throughout the CAM cycle, current peaking during the CAM cycle is reduced. The CAM system latches results in an output latch that is controlled by a one shot pulse generator.

20 Claims, 4 Drawing Sheets

OTHER PUBLICATIONS

Helwig, et al., "High Speed CAM", IBM Deutschland Entwicklung GmbH (1996).

Krishnamurthy, "Address Translation—Lecture Notes" (Spring 2004).

Krishnamurthy, "Address Translation (cont'd)—Lecture Notes" (Spring 2004).

Music Semiconductors, Application Note AN-N19, "Using The MU9C1965A LANCAM MP For Data Wider Than 128 Bits" (Sep. 1998).

Music Semiconductors, Prelim. Data Sheet—MU9C1965A/L LANCAM MP (Jul. 2002).

Music Semiconductors, Application Brief AB-N6—What is a CAM? (Sep. 1998).

PAGIAMTZIS, "Content—Adressable Memory Introduction" (c) 1993.

PAGIARRTZIS, "Low Power CAM Using Pipelined Hierarchical Search Scheme, IEEE Journal of Solid State Circuits", (Sep. 2004).

PAGIAMTZIS, Pipelined Match-Lines and Hierarchical Search-Lines for Low Power CAMs, IEEE (Sep. 2003).

Stojanovic, et al., "Comp Analysis of MS Latches", IEEE Journal of Solid-State Circuits, vol. 34, No. 4 (Apr. 1999).

* cited by examiner

METHOD AND APPARATUS FOR CONTROLLING THE TIMING OF PRECHARGE IN A CONTENT ADDRESSABLE MEMORY SYSTEM

CROSS REFERENCE TO RELATED PATENT APPLICATIONS

This patent application is related to the U.S. Patent Application entitled "Method and Apparatus For Selecting Operating Characteristics Of A Content Addressable Memory By Using A Compare Mask", inventors Joaquin Hinojosa, Eric Jason Fluhr, Michael Ju Hyeok Lee, Jose Angel Paredes and Ed Seewann, Application No. 11/055,803, filed Feb. 11, 2005, and assigned to the same assignee), the disclosure of which is incorporated herein by reference in its entirety.

This patent application is related to the U.S. Patent Application entitled "Content Addressable Memory Including a Dual Mode Cycle Boundary Latch", inventors Masood Ahmed Khan, Michael Ju Hyeok Lee and Ed Seewann, application Ser. No. 11/055,830, filed Feb. 11, 2005, and assigned to the same assignee, the disclosure of which is incorporated herein by reference in its entirety.

TECHNICAL FIELD OF THE INVENTION

The disclosures herein relate generally to content addressable memories (CAMs) and associated support logic, and more particularly to selecting the operating characteristics of CAM array systems.

BACKGROUND

A content addressable memory (CAM) used as an address translation system may be viewed conceptually as a search engine that is fabricated from hardware rather than software. Software search engines, which are algorithmically based, have a tendency to function substantially slower than hardware-based CAMs. CAMs, as a basis of their search function, can be formed from arrays of conventional semiconductor memory, for example static random access memory (SRAM), together with additional comparison circuitry that enables a search operation to finish in a single system clock cycle. One routine search-intensive task that benefits significantly from a CAM system is the address lookup task performed in routers such as Internet routers. Other typical uses of CAM include caches such as processor caches, translation look aside buffers (TLBs), database accelerators, and data compression applications.

CAM array systems typically employ an input data latch for temporary storage of compare input data or address lookup data. These CAM systems may also employ an address search line generator that generates true and complement data bit versions of the latched compare input data. The address search line data is buffered through a buffer or driver circuit that supplies the search line data to the input of a CAM array. A conventional CAM is configured as an array of individual binary CAM core cells. A typical binary CAM core cell supports the storage and searching of binary bits, namely one or zero (1, 0). A single CAM cell stores a binary bit as compare bitline data in "true and complement" data form, meaning a zero is stored in both a zero state and a complemented one state within the core cell. In contrast, a one is stored both as a one state and a complemented zero state. Horizontal and vertical rows of NOR-based architecture CAM core cells can be configured to form a large CAM array. In such an array, the CAM size is described first by the number of horizontal cells which is also called the word size. And second, the CAM size is described by the vertical cell count which corresponds to the number of words stored and available during a compare operation. In a compare operation, input data is simultaneously compared against each word stored in the CAM array.

CAM core cells include both storage and comparison circuitry. Compare bitlines or search lines run vertically through the CAM cell and broadcast the search data to all CAM cells at the same time. Match lines run horizontally across the array and indicate whether or not the search data matches a particular row's word. In more detail, an activated match line (an active high logic state) indicates a match and a deactivated match line (a low logic state) indicates a mismatch for a particular word corresponding to that match line. These match lines which describe the output of the CAM array are typically coupled to memory devices such as static random access memories (SRAMs) or dynamic random access memories (DRAMs) to provide the actual address translation or output match data.

A CAM search operation begins with precharging all match lines high, thereby placing all match lines temporarily in the match state. Next, interrogate or search lines broadcast the search data in binary vertically simultaneously across all words of the array. Then, each CAM core cell compares its stored single binary data against the bit on its corresponding search lines. Cells with matching data do not affect the corresponding word's match line, but cells with a mismatch pull down the corresponding word's match line to a binary zero state by deactivating their match line output. The aggregate result is that the match line of any word having at least one bit mismatch is pulled low. All other match lines remain activated (precharged high). Usually almost all match lines are driven low thus indicating mismatches for the words corresponding to those match lines. Typically, one or a small number of match lines will remain high to indicate a matching word or words. Finally, the match line(s) that remain high, indicating a matching word, are used as the input to an address lookup memory that is coupled to the output of the CAM. The wordline data thus addressed in the address lookup memory is then read from the address lookup memory and latched as output data to provide the ultimate result of the search.

CAM systems typically sequence compare data through each stage of the CAM system in a synchronous or predicted timing fashion wherein timing signals are generated in hardware within the CAM. These CAM timing signals are not adjustable once generated by the CAM circuitry. CAM timing signals can be critical to CAM performance since they may determine power use optimization. These CAM timing signals may also affect setup of data to be latched or tested in a CAM array. Moreover CAM timing signals may impact the settling time before output data is valid and latched.

CAM cell precharge and CAM cell evaluation are controlled by CAM timing signals. CAM systems are typically designed to minimize the collision or overlap between CAM cell precharge and the evaluation of the CAM array output. A collision or overlap of CAM cells precharge and evaluation results in undesirable power consumption and performance loss. This power loss may occur because CAM output transistors are driven for a period of time without valid resultant data being presented for the next sequential operation within the CAM system.

What is needed is a method of operating a CAM apparatus that solves the problems describe above such as lack of CAM timing signal adjustability and power loss problems.

SUMMARY

Accordingly, in one embodiment, a method is disclosed for operating a content addressable memory (CAM) system. The method includes receiving compare data by the CAM system. The CAM system includes a plurality of circuits that require precharge. The method also includes providing respective precharge signals to the plurality of circuits that require precharge. The precharge signals are staggered in time throughout a CAM cycle to reduce current peaking during the CAM cycle. The precharge signals are adjustable in time throughout the CAM cycle. The method further includes transmitting to an output a search result responsive to the compare data.

In another embodiment, a CAM system is provided that includes an input that receives compare data. The CAM system also includes a plurality of circuits that require precharge. The CAM system further includes; a plurality of circuits, coupled to the plurality of circuits that require precharge, respectively, that provides respective precharge signals to the plurality of circuits that require precharge. The precharge signals are staggered in time throughout a CAM cycle to reduce current peaking during the CAM cycle. The precharge signals are adjustable in time throughout the CAM cycle. The CAM system also includes an output to which a search result responsive to the compare data is supplied.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

CAM architecture systems commonly sequence the search line inputs through the CAM and RAM memory arrays with fixed and sequential timing generated directly from a main system clock. CAM hardware can provide some protection from collisions or overlap of precharge timing of CAM cells and evaluation of CAM cell results. It is possible however to achieve precise timing of CAM system operations with one shot pulse generators. Moreover, it is also possible to minimize or avoid CAM evaluation collisions by using one shot pulse generators. In a CAM address translation system, optimization between fast lookup times and reduced power consumption over an entire lookup cycle are desirable.

The timing of CAM timing signals can be critical to CAM performance with respect to power use. CAM timing signals also control the setup of data to be latched or tested in a CAM array. CAM timing signals also determine the settling time before CAM output data is valid and latched. Further, CAM systems are typically designed to minimize collision or the overlap between CAM cell precharge and the evaluation of the CAM array output. However, CAM timing signals are not adjustable once generated. In some circumstances, it is desirable to exert a high level of control over the timing of CAM system operations. A collision or overlap of the precharge and evaluation of CAM cells results in disadvantageous power consumption and performance degradation. This typically occurs because CAM output transistors are being driven for a period of time without valid resultant data being presented for the next sequential operation within the CAM system. In this situation, a dynamic clock pulse generation system can be employed to provide adjustable timing signals, namely a series of one shot pulses initiated by a main clock, but driven independently from the main clock once started. By providing this flexibility, CAM compare operations can be performed more quickly and efficiently in terms of reduced power consumption. One approach to prevent precharge and evaluation collisions is to employ a "footed domino" technique. In a footed domino method, clock phases are used to gate precharge and evaluation through a stack of series coupled transistor devices. Unfortunately such a technique comes at the cost of additional circuit logic and power consumption. To avoid this trade-off, or to create a footless domino CAM system, a method and apparatus are needed that can provide appropriate detailed timing and sequencing of the precharge and evaluation functions. This method and apparatus are needed so that precharge and evaluation collisions are minimized or avoided completely. This method and apparatus are also needed so that power consumption by the CAM system is reduced.

Problems with peak current consumption may be encountered when multiple precharges are conducted at the same time in a CAM cycle. The disclosed CAM system employs multiple precharges that precharge particular components of a CAM system as described below. The disclosed CAM system avoids precharge current peaking problems by distributing or spreading the precharges over time in a CAM cycle. In one embodiment, the precharges are offset from one another in time so that the precharges do not overlap during a CAM cycle. This allows the CAM system to be physically smaller since the CAM system can be fabricated to withstand much smaller peak precharge current. Moreover, the CAM system can be physically smaller because heating problems associated with high peak precharge currents are substantially reduced.

Figure 1:
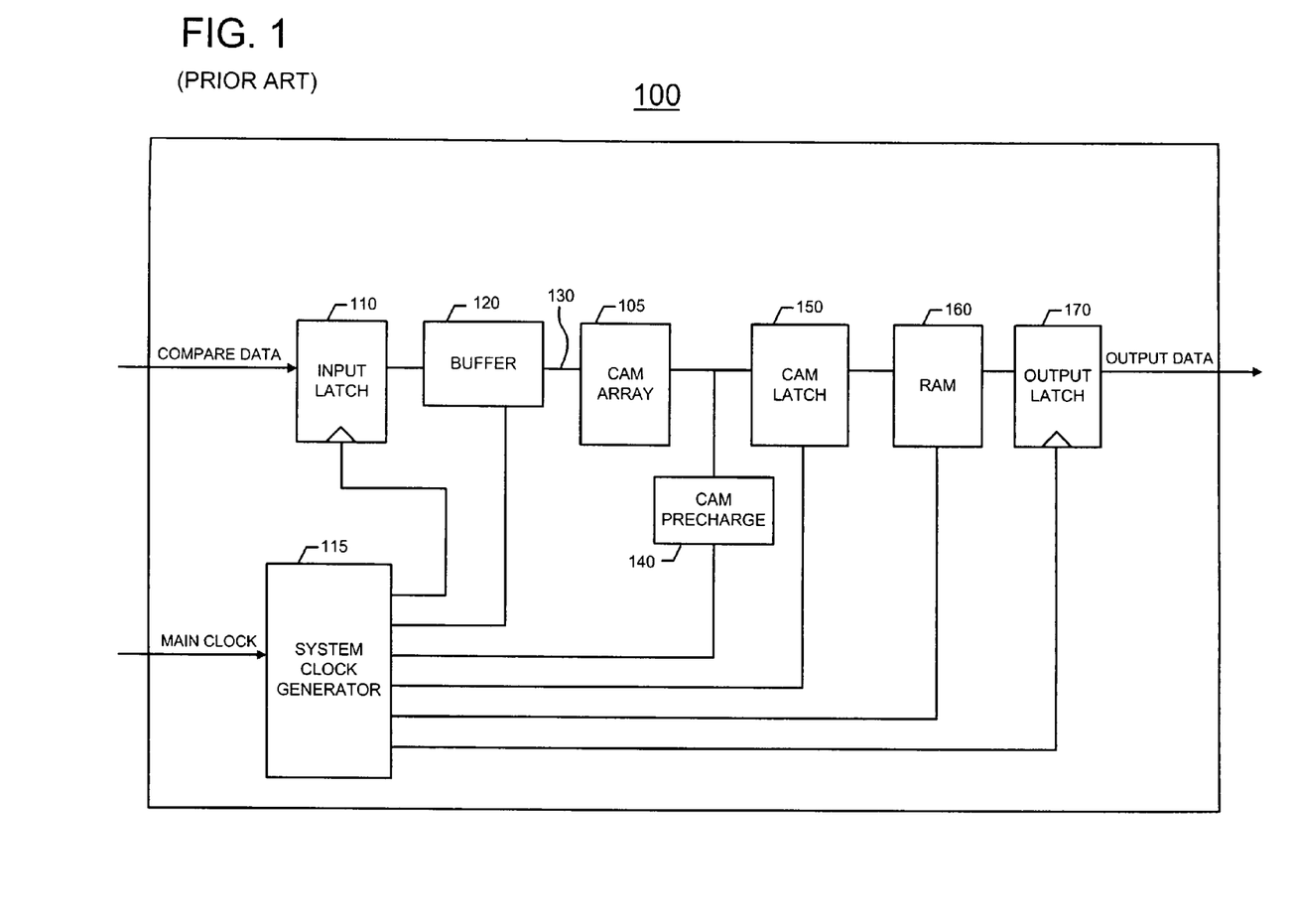
FIG. 1 is a block diagram illustrating a conventional content addressable memory (CAM) system.

FIG. 1 is a block diagram of a conventional content addressable memory CAM system 100 which illustrates the problems discussed above in more detail. CAM system 100 includes an input latch 110 to which compare data is supplied. CAM system 100 conducts a search to determine if the word pattern of the compare data matches any word entry stored in CAM array 105.

A system clock generator 115 includes timing logic that generates all timing signals used by CAM system 100. A main clock (not shown) supplies a main clock signal to system clock generator 115. System clock generator 115 is coupled to input latch 110. Input latch 110 latches the compare data supplied thereto. In other words, input latch 110 stores the compare data to be searched in CAM system 100. CAM system 100 uses the compare data as an address for which address translation is desired. Input latch 110 is coupled to a buffer 120 which generates a true and complement differential form of the compare data received from input latch 110. System clock generator 115 is coupled to buffer 120 to provide buffer 120 with the proper timing signal to turn on the output of buffer 120. When the output of buffer 120 is turned on in this manner, compare search lines 130, coupled between buffer 120 and CAM array 105, transmit the buffered compare data to CAM array 105. Compare search lines 130 describe the differential true and complement interrogate lines used in typical CAM array system searches. CAM array 105 is a content addressable memory array which searches for a match between the compare data supplied thereto and the data contained within CAM array 105.

CAM array 105 must be precharged in order to provide for proper lookup or search for a match therein. System clock generator 115 is coupled to a CAM precharge circuit 140 to instruct precharge circuit 140 when to provide such a precharge. CAM precharge circuit 140 is coupled to the output of CAM array 105 to provide precharge thereto prior to CAM array 105 commencing the search for a match to the compare data. CAM array 105 generates match line data at its output which is coupled to a CAM latch 150. The match line data at the CAM array output includes match information indicating whether or not CAM array 105 found a match to the compare data. The match line data generated by CAM array 105 may also be called matching word lines, matching word line data or match result. System clock generator 115 is coupled to CAM latch 150 to instruct CAM latch 150 when to latch or store the match result received from CAM array 105.

CAM latch 150 is coupled to a RAM 160 which provides the address lookup of the matching word line data or match result. RAM 160 mirrors or stores the same words or possible matches contained in CAM array 105 in a manner so that they are readily accessible for output to output latch 170. In this example, CAM array 105 and RAM 150 store addresses, one of which matches the compare data, as indicated by the match result provided to RAM 160. System clock generator 115 is coupled to RAM 160 to provide a timing signal that instructs RAM 160 when the sufficient evaluation time has passed so that RAM 160 can output a valid match result to output latch 170. As seen in FIG. 1, RAM 160 is coupled to output latch 170 to latch the output of RAM 160.

System clock generator 115 is coupled to an output latch 170 to provide a timing signal that instructs output latch 170 when to latch the match result, namely a matching address in this example, that output latch 170 receives from RAM 160. Output latch 170 outputs this match result as output data of CAM system 100.

CAM system 100 exemplifies a conventional CAM address translation system which utilizes a CAM array and RAM lookup memory to translate an address. This example demonstrates the timing signals necessary to move data from stage to stage of CAM system 100, namely through the following stages: input latch 110, buffer 120, CAM precharge 140, RAM 160 and output latch 170. These timing signals are critical to the effectiveness of the system, more specifically the settling of output data prior to latching for the next sequential event. Clock signal generator 115 generates these timing signals as independent clock signals. One significant limitation of CAM system 100 is its inability to optimize the timing signals between stages within CAM system 100 such as the timing of precharge and settling of evaluated data prior to latching.

Figure 2:
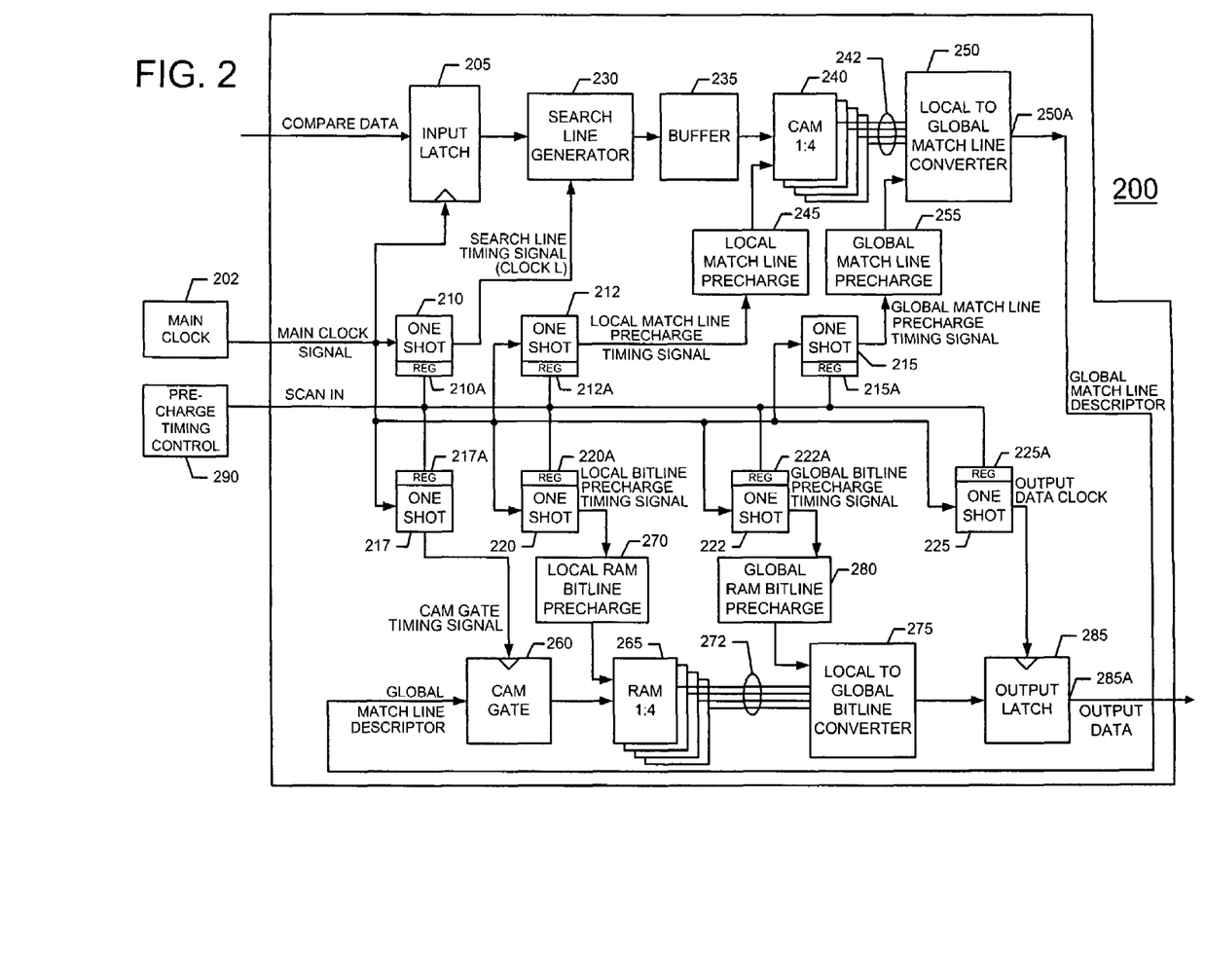
FIG. 2 is a block diagram of the disclosed CAM system including a series of one shot timing pulse generators which solve problems associated with the system of FIG. 1.

Before discussing CAM system 200 of FIG. 2 in detail, it is first noted that one embodiment of the disclosed CAM system provides for a "footless domino circuit, namely a system that does not require additional discrete transistor circuitry to protect against overlap or collision of precharge and evaluation timing periods within the CAM system. An additional feature of this embodiment is the memory cell orientation within the CAM array system. More specifically, the CAM system includes a compare array that supports a multiple level CAM hierarchy, the first of which is described as a 64 bit search line CAM array grouped in sets or groups of 16 CAM cells arranged so as to tie to a single match line. Such a single match line is referred to as a local match line. This memory cell orientation generates 4 such groups per horizontal row of individual CAM cells. These 4 sets of local match lines are integrated into an AND function which is described as local to global match line converter to generate a resultant single global match line per horizontal set of 64 individual CAM cells. This technique can be used with any number of CAM cells and is not limited to greater, less than, or equal to 64 search line wide CAM array systems. By splitting up the total number of CAM cells into these two groups of 16 and 4, an optimization or power saving ability is realized. Additionally the RAM array is organized in a similar fashion. RAM array memory cells are organized into local and global bitline results, again an AND function which is described as the local to global bitline converter is used to generate the data resultant which in turn is latched as output data of the CAM system.

FIG. 2 shows one embodiment of the disclosed CAM system 200. CAM system 200 includes an input latch 205 to which compare data is supplied in a standard word size, for example 64 bits. CAM system 200 can accommodate other word sizes as well. As described in more detail below, CAM system 200 uses input compare data to perform a search against any word entry stored therein. CAM system 200 includes a main clock signal generator 202. Main clock 202 is coupled to input latch 205 to provide input latch 205 with a main clock timing signal that instructs latch 205 when to latch compare data provided thereto. Main clock 202 is also coupled to a series of seven one shots, namely one shot 210, one shot 212, one shot 215, one shot 217, one shot 220, one shot 222, and finally one shot 225. In this manner, the main clock signal is provided to all seven one shots. The main clock signal is discussed in more detail below.

Input latch 205 is coupled to a search line generator 230, the output of which generates a true and complement binary form of the search input data word, in this example 64 bits of differential data or 128 total bits. Search line generator 230 generates output data at a rate controlled by a search line timing signal, clock L, provided by one shot 210. The output of search line generator 230 is coupled to a buffer 235. Buffer 235 includes driver circuitry to provide sufficient signal strength to drive the search line data into a 1:4 CAM array 240. 1:4 CAM array 240 is depicted in FIG. 2 as 4 separate CAM arrays, one atop the other, each of which represents 16 individual CAM cells combined with NOR based CAM logic to provide individual local match lines 242. Four match lines 242 or the combined four CAM arrays represent the total of 64 match lines in the disclosed representative CAM cell configuration. All CAM cells within 1:4 CAM array 240 are precharged high by a local match line precharge circuit 245 coupled to 1:4 CAM array 240. One shot 212 controls the timing of the local match line precharge signal timing signal that one shot 212 provides to local match line precharge circuit 245. In response to the local precharge timing signal, local match line precharge circuit 245 supplies a local precharge to 1:4 CAM array 240.

CAM system 200 also includes a local to global match line converter 250 which includes 4 inputs coupled to each of CAM 1:4 240 outputs 242. One shot 215 is coupled to a global match line precharge circuit 255 and provides the global match line precharge timing signal which initiates a global match line precharge operation. The output of global match line precharge circuit 255 is coupled to local to global match line converter 250 for this operation. Local to global match line converter 250 effectively ANDs the four outputs of CAM array 240 and generates an individual global match line descriptor it its output 250A. This global match line descriptor represents the combined match line of all horizontally linked individual CAM cells in the CAM array 240. The output of local to global match line converter 250 is coupled to the input of a CAM gate 260 to supply the global match line desciptor thereto.

CAM system 200 includes a one shot 217 that is coupled to main clock 202. One shot 217 generates a CAM gate timing signal that is supplied to CAM gate 260 to latch the global match line descriptor and present the global match line descriptor to a 1:4 RAM array 265. The global match line descriptor acts a pointer to the word line or address in RAM array 265 where the search result is stored.

In a manner similar to 1:4 CAM array 240, 1:4 RAM 265 array is organized as 4 sets of RAM lookup cells as described in more detail below. One shot 220 provides a local bitline precharge timing signal that is supplied to a local RAM bitline precharge circuit 270. Local RAM bitline precharge circuit 270 is coupled to 1:4 RAM 265 to precharge RAM 265 at a time controlled by the local bitline precharge timing signal 1:4 RAM 265 contains multiple RAM cells linked together to form a resultant complete set of local bitline data. More particularly, RAM 265 is coupled as a set of four outputs 272 to the input of a local to global bitline converter 275. One shot 222 is coupled to main clock 202. One shot 222 provides a global bitline precharge timing signal to global RAM bitline precharge circuit 280. At a time indicated by the global bitline precharge timing signal, global RAM bitline precharge circuit 280 provides a global RAM bitline precharge to local to global bitline converter 275. Local to global bitline converter 275 completes evaluation by assembling the data retrieved from RAM 265 at the location indicated by the global match line descriptor together to form the ultimate search result.

Local to global bitline converter 275 is coupled to output latch 285 to provide the search result thereto. One shot 225 is coupled to main clock 202 and to output latch 285. One shot 225 supplies output latch 285 with a timing signal that instructs output latch 285 to latch the result therein when evaluation is complete. Output latch 285 outputs the result as output data at output 285A.

Figure 3:
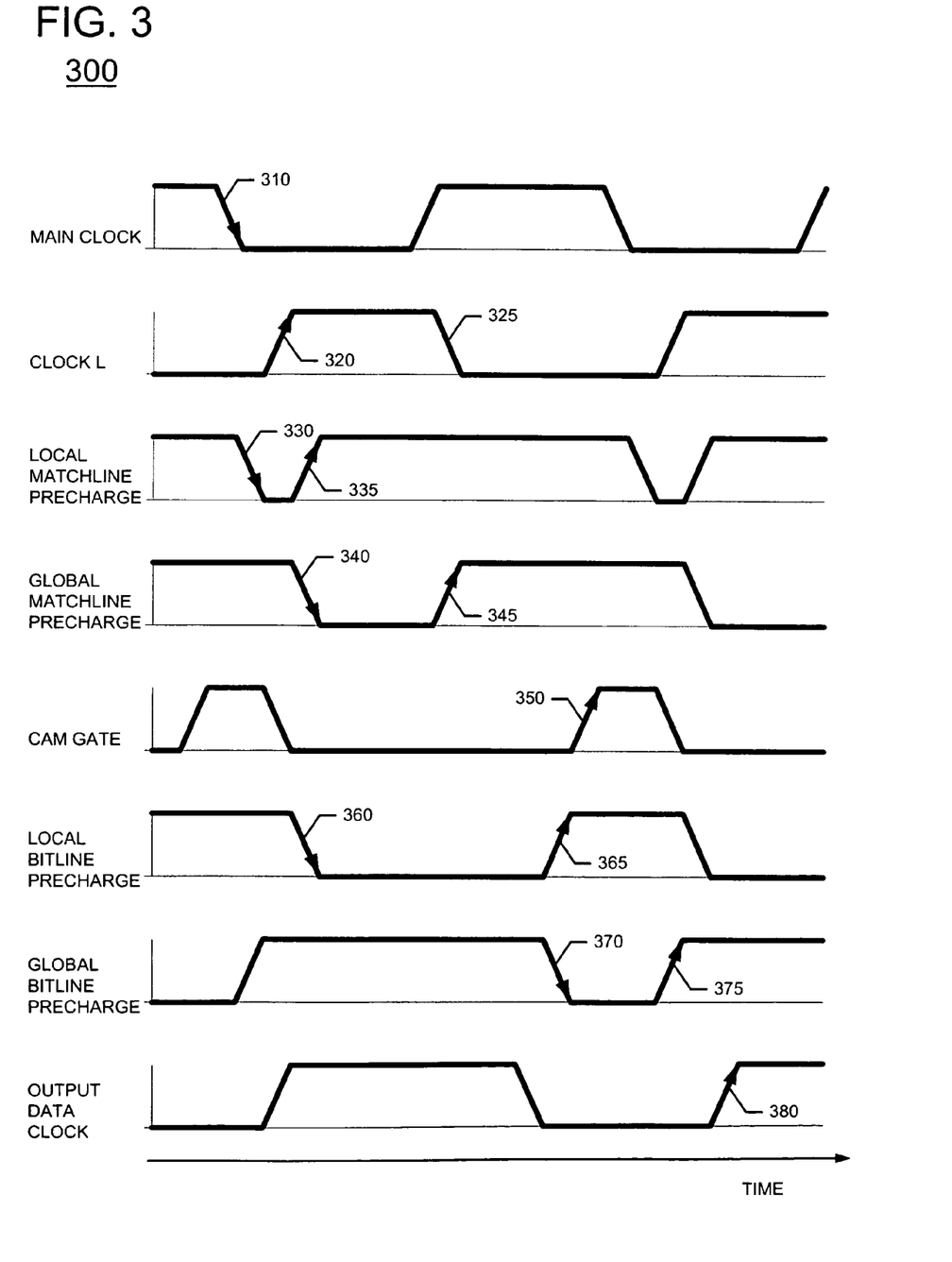
FIG. 3 is a timing diagram of the disclosed CAM system which further describes the operation of CAM system 200 of FIG. 2.

Each of one shot circuits 210, 212, 215, 217, 220, 222 and 225 includes a scan register which can adjust the timing and pulse width of the pulse that each one shot circuit generates at its output. More particularly, one shot circuits 210, 212, 215, 217, 220, 222 and 225 include scan registers 210A, 212A, 215A, 217A, 220A, 222A and 225A, respectively as shown in FIG. 2. One shot circuits 210, 212, 215, 217, 220, 222 and 225 couple to a precharge timing control circuit 290. Timing control circuit 290 sends scan in data to each one shot circuit to instruct that one shot circuit when to fire its output pulse and to control the duration of that pulse. As will be seen below in the timing diagram of FIG. 3, the timing of the one shot precharge pulses, namely local match line precharge, global match line precharge, local bitline precharge, global bitline precharge is distributed or spread over the CAM cycle to avoid a peak in precharge current. Moreover, timing control 290 also times the search line timing signal (clock L), CAM gate timing signal, and output date clock signal as seen in FIG. 3 so that the corresponding one shot pulses are distributed or spread throughout the CAM cycle. If some precharge current peaking is still observed, timing control 290 can write values to a scan register of one of the one shots to move that one shot's output pulse forward or backward in time to decrease the peak. Moreover, timing control 290 can write a value to the one shot to increase or decrease the duration of that one shot's output pulse. Timing control 217 can thus adjust both the timing distribution of the one shot pulses throughout the CAM cycle and also the pulse width of the one shot pulses generated in that CAM cycle. In this manner, peaking of precharge current in the CAM cycle can be substantially reduced.

FIG. 3 shows a representative timing diagram for CAM system 200 of FIG. 2. This timing diagram depicts the above-discussed one shot timing signals and the unique relationship among these timing signals within CAM system 200. Main clock is shown as the first of eight timing signals. The falling edge 310 of the main clock signal initiates the CAM and RAM search and lookup cycle in CAM system 200. In addition to latching the search data input or compare data in input latch 205, main clock falling edge 310 also triggers all seven one shots as previously described with respect to FIG. 2, namely one shot 210, one shot 212, one shot 215, one shot 217, one shot 220, one shot 222, and finally one shot 225. As will be described below, these one shot circuits provide the timing associated with the remaining seven timing signals shown in FIG. 3, namely the search line timing signal (clock L), the local match line precharge timing signal, the global match line precharge timing signal, the CAM gate timing signal, the local bitline precharge timing signal, the global bitline precharge timing signal and the output data clock.

It is noted that CAM system 200 provides individual discrete timing adjustment for each of seven one shot pulse generators. By providing for fine pulse width timing adjustments, precise optimization of power usage and collision avoidance, as well as setup and latch time adjustments can be accomplished.

The falling edge 310 of the main clock triggers one shot 210 to generate the rising edge 320 of clock L. Rising edge 320 causes search line generator 230 to generate the true and complement versions of search line data input from the compare data. The pulse width, or period that clock L stays high is defined as the timing pulse width of one shot 210 and represents the minimum period of time necessary to continue supplying search lines through buffer 235 and into 1:4 CAM array 240. When clock L goes low at falling edge 325, the search lines are no longer presented as input to the CAM array 240 and it is expected that the interrogation of the CAM cells initiated properly.

The local match line precharge timing signal shown in FIG. 3 is initiated also by main clock falling edge 310. On the falling edge 310 of the main clock, one shot 212 causes the local matchline precharge timing signal to generate falling edge 330. Falling edge 330 triggers local match line precharge circuit 245 to begin the precharge of the local match lines within CAM array 240. The local match line precharge timing signal stays low so that local match line precharge circuit 245 can precharge the local match lines of CAM array 240. More particularly, the local match line precharge timing signal must remain low for at least the minimum period of time need to ensure the local CAM cells in CAM array 240 are completely precharged or pulled high. However, the local match line precharge timing signal must not stay low so long as to overlap the evaluation of the local CAM cells. If the local match line precharge timing signal remained low too long, the resultant collision between precharge of local CAM and evaluation of local CAM may result in invalid data or, unnecessary power use, by dragging down transistor logic within the CAM array for longer than required for a valid search operation. This local match line precharge timing is important to the search and translation operations of CAM system 200. The rising edge 335 of the local match line precharge timing signal corresponds to the end of the precharge period for the local CAM array within CAM array 240. Rising edge 335 triggers the settling time for the output result or local match line data. Subsequent to rising edge 335, the evaluation period for the local CAM output result commences and CAM array 240 presents the local CAM output result to local to global match line converter 250.

During the evaluation of the local CAM output or local match line data the precharge of global CAM by global match line precharge circuit 255 initiates. One shot 215 generates the global match line precharge timing signal shown in FIG. 3. The falling edge 340 of the global match line precharge timing signal instructs global match line precharging circuit to begin the global match line precharge. The rising edge 345 of the global match line precharge timing signal instructs global match line precharge circuit 255 to end the global match line precharge. The global matchline CAM precharge signal is staggered or offset with respect to the local CAM precharge signal to provide better utilization of power distribution across CAM system 200 and to provide for proper evaluation setup time for the local CAM match line date prior to the evaluation of the global match line data. The rising edge 345 of the global match line precharge signal corresponds to the end of the precharge period for the local to global match line converter 250 and begins the settling time for the output result or global match line data presented to CAM gate 260.

One shot 217 generates the rising edge 350 of the CAM gate timing signal relative to the falling edge 310 of main clock 202. The rising edge 350 of the CAM gate timing signal is triggered by one shot 217 after the evaluation of global match line data is complete. The rising edge 350 of the CAM gate timing signal triggers the latching of the global match line data descriptor which CAM gate 260 then presents to the input of RAM 1:4 265 as wordline data. The CAM gate timing signal must remain high sufficiently long allow CAM gate 260 to latch the global match line descriptor that local to global match line converter 250 presents to CAM gate 260.

One shot 220 generates the local bitline precharge timing signal shown in FIG. 3. The local bitline precharge timing signal controls the precharge of the local bitlines of 1:4 RAM array 265. One shot 220 fires to generate a falling edge 360 in the local bitline precharge timing signal. The local bitline precharge timing signal stays low sufficiently long to initiate local RAM bitline precharge and complete the precharge of the local RAM bitline array 265. This precharge operation ends at the rising edge 365 of local bitline precharge timing signal 365. During this local RAM bitline precharge period, the local RAM array within RAM 265 is taken high or precharged and prepared for evaluation. Following the rising edge of the local bitline precharge 365 timing signal, an evaluation period begins for the local RAM array data in RAM 265.

Following the local RAM bitline precharge and evaluation, the global bitline precharge timing signal initiates a global RAM bitline precharge of the local to global bitline converter 275. More particularly, one shot 222 generates a falling edge 370 in the global bitline precharge timing signal. Falling edge 370 actually initiates the global RAM bitline precharge. Global RAM bitline precharge circuit 280 completes the precharge cycle for the global RAM array within the local to global bitline converter 275 prior to the rising edge 375 of the global bitline precharge timing signal. Rising edge 375 begins the evaluation of the final global RAM bitline results which are presented to output latch 285.

Finally, one shot 225 generates an output data clock timing signal including a rising edge 380 positioned relative in time to the main clock signal falling edge 310 is seen in FIG. 3. Rising edge 380 of the output data clock timing signal triggers output latch 285 to latch the output data that output latch 285 receives from local to global bitline converter 275. The data thus latched is provided to latch output 285A.

The timing signals shown in FIG. 3 represent a complete CAM to RAM lookup cycle and repeat with each falling edge 310 of the main clock timing signal. By staggering precharge timing signals in this fashion and by providing for proper settling time and evaluation time for each memory cell precharge and evaluation, CAM system performance is improved both in terms of power consumption and speed of evaluation. In summary, the timing diagrams of FIG. 3 show how precharge timing control circuit 290 instructs one shots 210, 212, 215, 217, 220, 222 and 225 to distribute one shot pulses through the CAM cycle to reduce current peaking during the CAM cycle. The local match line precharge, global match line precharge, local RAM bitline precharge and global RAM bitline precharge are advantageously spread in time during the CAM cycle to avoid such current peaking. In one embodiment the one shot pulses are staggered throughout the CAM cycle in non-overlapping fashion. Such improvements have been observed for address translation applications of CAM systems.

Figure 4:
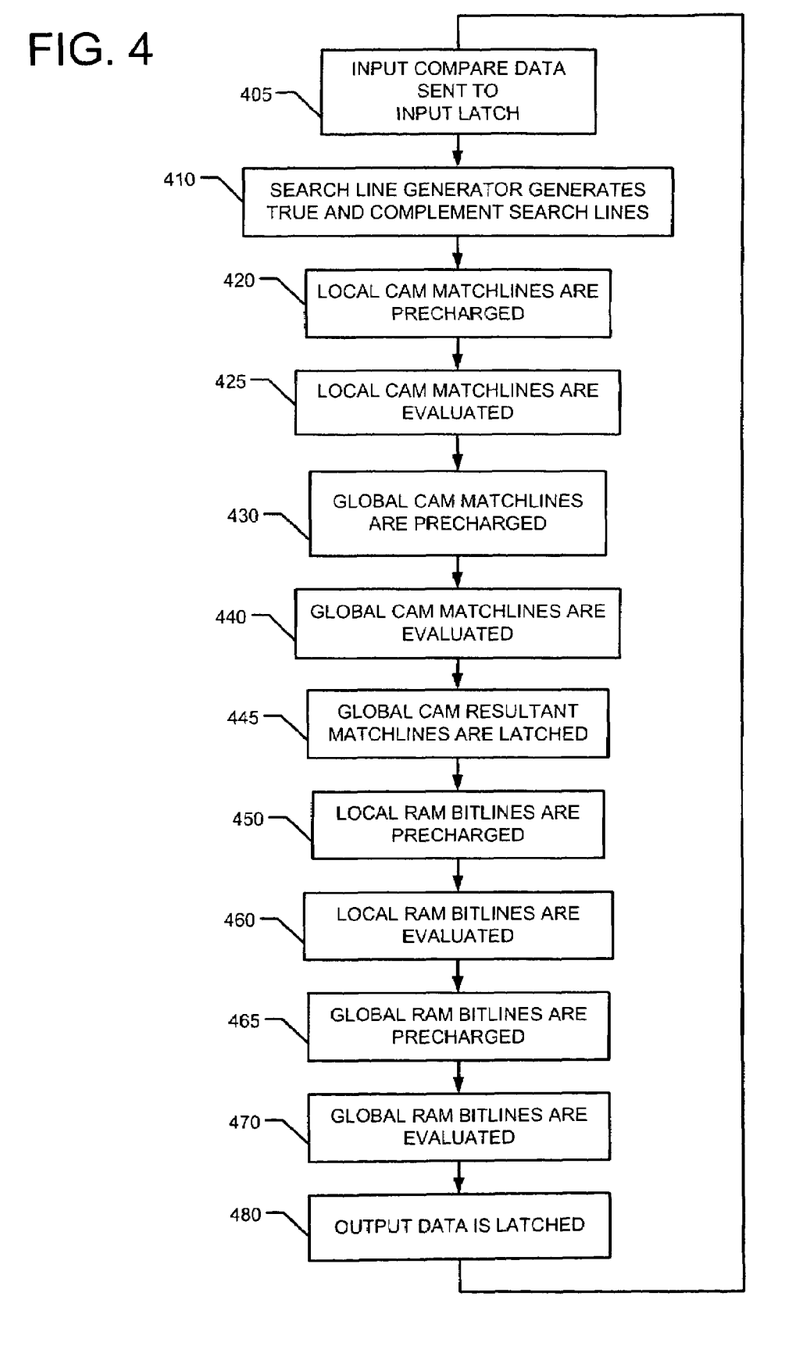
FIG. 4 is a flow chart that depicts process flow in the disclosed CAM system.

FIG. 4 is a flow chart depicting process flow when CAM system 200 implements the disclosed methodology. Input compare or search data is supplied to input latch 205 of CAM system 200 as per block 405 of FIG. 4. The falling edge of the main clock timing signal shown in FIG. 3 initiates the latching of compare data input. In this example, CAM system 200 uses a representative word size of 64 bits, although other word sizes can be used as well.

Next, as per block 410, search line generator 230 which receives compare data from input latch 205, generates the true and complement versions of the input compare data and provides these versions as input to buffer 235. Buffer 235 supplies the true and complement version as search line input presented to CAM array 240, which is the entire CAM array of CAM system 200. One shot 210, which is triggered by the falling edge of the main clock timing signal, generates the clock L search line timing signal which actually initiates the search line generator function.

One shot 212, which is initiated by falling edge of the main clock timing signal, generates a local match line precharge timing signal. The local match line precharge timing signal controls the local match line precharge circuit 245 function as per block 420. Local match line precharge circuit 245 sets all local match lines of CAM array 240 to a high state, i.e. a precharged stat. The local match lines are maintained in a precharged condition for the period of the one shot timing pulse from one shot 212 as per block 420.

As per block 425, CAM array 240's local match lines begin evaluation. This evaluation process is triggered by the local matchline precharge timing signal going high. The locate matchline precharge timing signal going high represents the end of the local matchline precharge cycle. The local match lines of 1:4 CAM array 240 are organized in four sets of 16 representative CAM cells, thus providing a total of 64 individual CAM array cells. Each set of 16 CAM cells is shown as one of four CAM arrays (1:4) which generate four individual outputs coupled to local to global matchline converter 250.

One shot 215, which is triggered by the falling edge the main clock, is presented to global match line precharge circuit 255 per block 430. One shot 215 initiates a falling edge of global match line precharge timing signal which is provided to local to global match line converter precharge circuit 250. In response, precharge circuit 250 begins precharging local to global match line converter 250. The rising edge of the global match line precharge timing signal represents the end of this precharge. The rising edge of the global match line precharge timing signal also starts the evaluation period for the global match lines which are output from local to global match line converter 250 to CAM gate 260 per flowchart block 440.

Per block 445, global CAM match line results, represented by the global match line descriptor, are latched by CAM gate 260 in response to the CAM gate timing signal generated by one shot 217. CAM gate 260 latches the resultant Global CAM match lines as the input to 1:4 RAM 265 and provides the global match line descriptor to 1:4 RAM until the next evaluation cycle.

The 1:4 RAM 265 array is organized in a fashion similar to the 1:4 CAM 240 array in that groups of RAM cells are linked together for a lookup match and separated into four distinct RAM array sections within RAM 265 to optimize search time and power usage. Per block 450, one shot 220 generates the local bitline precharge timing signal in response to the falling edge of the main clock signal. The local bitline precharge timing signal causes local RAM bit line precharge circuit 270 to provide precharge signals to RAM array 265. Local RAM bitline precharge 270 presents RAM 1:4 265 with precharge signals, which in turn set all local RAM bitlines to high for pre-evaluation setup.

Local bitline data which is output from 1:4 RAM 265 is presented as input to local to global bitline converter 275 in the form of each of 4 sections of the RAM local bitline array as seen in FIG. 2. The rising edge of the local bitline precharge signal corresponds to the initiation of the evaluation of local RAM bitlines as per block 460 of the flowchart of FIG. 4.

The falling edge of the main clock signal triggers one shot 222 causes global bitline precharge circuit to generate a global bitline precharge timing signal related in time to the main clock signal. Global RAM bitline precharge 280 circuit is coupled to local to global bitline generator 275 and initiates the precharge phase of the global bitlines per block 465. When precharge completes, evaluation of the global RAM bitlines begins with the rising edge of the global bitline precharge timing signal again as described above with reference to the CAM system timing diagram of FIG. 3. Evaluated global RAM bitlines are presented to output latch 285 from local to global bitline converter 275 as per block 470.

Finally, the falling edge of the main clock signal triggers one shot 225 that generates the output data clock signal which is supplied to output latch 285. In response, output latch 285 latch the search result received from local to global bitline converter 275 and provides output to that search result at output 285A. At this point, CAM system 200 has completed a full cycle of search and corresponding CAM to RAM lookup data output. As seen in the flowchart of FIG. 4, the process now repeats by initiating a new translation lookup in CAM system 200 per. block 405. During this process, CAM system 200 distributes the firing of one shots 210, 212, 215, 217, 220, 222 and 225 so that local match line precharge, global match line precharge, local RAM bitline precharge and global RAM bitline precharge are distributed it time, or staggered, throughout the CAM cycle to reduce current peaking in the CAM cycle.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of operating a CAM system comprising:
   receiving compare data by the CAM system, the CAM system including a plurality of circuits that require precharge;
   providing respective precharge signals to the plurality of circuits that require precharge, the precharge signals being staggered in time throughout a CAM cycle to reduce current peaking during the CAM cycle, the precharge signals being adjustable in time throughout the CAM cycle; and
   transmitting, to an output, a search result responsive to the compare data.

2. The method of claim 1 including adjusting the duration of the precharge signals throughout the CAM cycle.

3. The method of claim 2 wherein adjusting the duration of the precharge signal is performed by a respective one shot device for each precharge signal.

4. The method of claim 1 including adjusting the timing of the precharge signals such that the precharge signals are non-overlapping throughout the CAM cycle.

5. The method of claim 4 wherein adjusting the timing of the precharge signals such that the precharge signals are non-overlapping is performed by a respective one shot device for each precharge signal.

6. The method of claim 1 wherein one of the precharge signals comprises a local match line precharge.

7. The method of claim 1 wherein one of the precharge signals comprises a global match line precharge.

8. The method of claim 1 wherein one of the precharge signals comprises a local RAM bitline precharge.

9. The method of claim 1 wherein one of the precharge signals comprises a global RAM bitline precharge.

10. A CAM system comprising:
    an input that receives compare data:
    a plurality of circuits that require precharge;
    a plurality of circuits, coupled to the plurality of circuits that require precharge, respectively, that provides respective precharge signals to the plurality of circuits that require precharge, the precharge signals being staggered in time throughout a CAM cycle to reduce current peaking during the CAM cycle, the precharge signals being adjustable in time throughout the CAM cycle; and
    an output to which a search result responsive to the compare data is supplied by the CAM system.

11. The CAM system of claim 10 including a timing control circuit that adjusts the duration of the precharge signals throughout the CAM cycle.

12. The CAM system of claim 10 including a timing control circuit that adjusts the timing of the precharge signals such that the precharge signals are non-overlapping throughout the CAM cycle.

13. The CAM system of claim 10 wherein one of the precharge signals comprises a local match line precharge.

14. The CAM system of claim 10 wherein one of the precharge signals comprises a global match line precharge.

15. The CAM system of claim 10 wherein one of the precharge signals comprises a local RAM bitline precharge.

16. The CAM system of claim 10 wherein one of the precharge signals comprises a global RAM bitline precharge.

17. The CAM system of claim 10 including a plurality of one shot devices coupled to the timing control circuit, each one shot device being coupled to a respective one of the plurality of circuits that require precharge to control the precharge thereof.

18. A CAM system comprising:

a plurality of CAM subsystems requiring precharge;

a plurality of precharge circuits coupled to the plurality of CAM subsystems, respectively, to supply precharge signals thereto;

a plurality of one shot devices coupled to the plurality of precharge circuits, respectively; and a timing control circuit, coupled to the plurality of one shot devices, to cause the plurality of precharge circuits to supply precharge signals that are staggered in time over a CAM cycle to the plurality of CAM subsystems.

19. The CAM system of claim 18 wherein the timing control circuit adjusts the duration of the precharge signals throughout the CAM cycle.

20. The CAM system of claim 18 wherein the timing control circuit adjusts the timing of the precharge signals to be non-overlapping throughout the CAM cycle.

* * * * *